(12) United States Patent
Vaara et al.

(10) Patent No.: US 6,958,653 B2
(45) Date of Patent: Oct. 25, 2005

(54) TEMPERATURE COMPENSATED AMPLIFIER

(75) Inventors: Sami Vaara, Turku (FI); Sami Vilhonen, Turku (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/836,677

(22) Filed: Apr. 30, 2004

(65) Prior Publication Data

US 2004/0239424 A1    Dec. 2, 2004

(30) Foreign Application Priority Data

May 26, 2003   (FI)   .................................. 20030791

(51) Int. Cl.[7] ............................................... H03F 3/45
(52) U.S. Cl. ...................... 330/256; 330/254; 330/278
(58) Field of Search ............................... 330/256, 254, 330/252, 253, 277–279, 272

(56) References Cited

U.S. PATENT DOCUMENTS

| | | | |
|---|---|---|---|
| 3,970,947 A | 7/1976 | Sato et al. ................... | 330/261 |
| 5,994,961 A | 11/1999 | Lunn et al. .................. | 330/254 |
| 6,359,511 B1 * | 3/2002 | Phanse et al. ............... | 330/254 |
| 6,636,099 B2 * | 10/2003 | Shkap ........................ | 327/350 |
| 6,711,391 B1 * | 3/2004 | Walker et al. ............ | 455/234.1 |

OTHER PUBLICATIONS

Patent Abstracts of Japan; Toshiba Corp.; "Temperature Compensated Amplifier"; Pub. No. 2000-244250 A, Pub. Date Sep. 8, 2000.
Patent Abstracts of Japan; NEC Corp.; "Temperature Compensation Circuit for Gain Control Amplifier" Pub. No. 10270949A, Pub. Date Oct. 9, 1998.

* cited by examiner

Primary Examiner—John B Nguyen
(74) Attorney, Agent, or Firm—Harrington & Smith, LLP

(57) ABSTRACT

A temperature compensated amplifier with variable gain and to a radio device having an amplifier according to it. The gain control and temperature compensation of a differential amplifier (210) are implemented by a control circuit (220), which has a balanced and differential output ($V_1$, $V_2$). The output voltage of the control circuit, or the control voltage, is arranged to be proportional to difference between two source currents ($I_{GT1}$, $I_{GT2}$), which difference can be varied on both sides of zero. The output of the control circuit is connected to the bases of the differential pair (Q1, Q2) of the variable gain amplifier, whereupon the ratio of the output current ($i_{out}$) to the input current ($i_{in}$) of the pair becomes dependent on the control voltage. This is arranged to be proportional to the absolute temperature, too. A temperature change then changes the control voltage the more the higher the control voltage is. The temperature coefficient is adjusted so that the effect of the temperature on the current difference of the differential pair of the variable gain amplifier is compensated. Owing to differential type control circuit the current gain with temperature compensation can be varied in the whole range 0 . . . 1.

6 Claims, 3 Drawing Sheets

TEMPERATURE COMPENSATED AMPLIFIER

FIELD OF THE INVENTION

The invention relates to a temperature compensated amplifier with variable gain. The invention also relates to a radio device having a temperature compensated amplifier with variable gain.

BACKGROUND OF THE INVENTION

The temperature affects the function of electronic circuits e.g. owing to temperature dependence of the voltage of semiconductor junctions. In amplifiers a temperature change causes changes in currents and as a result of that change in the gain. Concerning power stage of a radio transmitter a change in the gain means an unintentional change of the antenna's radiation power. In mobile terminals the transmitting power is intentionally tried to set to a value, which is just sufficient. Unnecessary high transmitting powers cause rise of the noise level in radio network, which is tried to be avoided, of course. Especially in WCDMA system (Wideband Code Division Multiple Access), which is becoming more general, it is important to keep the noise level in the network as low as possible. Hence the gain of the transmitters of terminals accurately has to stick to the set value.

Drift caused by temperature changes has for a long time been prevented by compensation principle. In that case a circuit is designed so that the effects of temperature sensitive circuit elements to the quantity at issue are balanced. For example the voltage over a series connection of a forward biased semiconductor junction and a 6.8 volt zener diode is nearly independent of the temperature, because the voltage of a forward biased semiconductor junction changes about −2 mV/° C. and the voltage of a zener diode about +2 mW/° C. In amplifiers a change in current and in level of the output signal, caused by temperature changes, can be prevented by arranging an opposite change, which is based on change in a certain junction voltage. FIG. 1 shows an example of known variable gain amplifier with temperature compensation. The amplifier 100 comprises an amplifier proper 110 and control circuit 120 thereof. The amplifier proper 110 has a differential pair Q1-Q2. The emitters of these transistors are connected to a controllable signal current source 111, the second terminal of which being connected to the ground. The collector of the first transistor Q1 is directly connected to the supply voltage $V_S$ and the collector of the second transistor Q2 is connected to a load of the amplifier, the load being not shown in FIG. 1. When the base currents of the transistors are not taken into account, the current $i_{in}$ of the current source 111 is sum of the first collector current $i_1$ and the second collector current $i_2$. The signal current source 111 is controlled by the input signal $v_{in}$ of the amplifier. The second collector current $i_2$ is at the same time the output signal $i_{out}$ of the amplifier. The base of the first transistor Q1 is connected to a reference voltage $V_{ref}$ through a resistor R11 and the base of the second transistor Q2 is connected to the output of the control circuit 120 through a resistor R12.

The term "differential pair" means in this description and in the claims two transistors, the emitters of which are connected together. The total emitter current is then divided between the transistors in a certain ratio depending on the control led to the bases.

The control circuit 120 comprises an operational amplifier A11, a feed back resistor R13 thereof and the second current source 121. The non-inverting input of the operational amplifier is connected to the above-mentioned reference voltage $V_{ref}$ and the current source 121 is connected from the inverting input to the ground. The current source is controlled externally by the gain control signal G. The direction of the source current $I_{GT}$ is towards the ground, in which case the output voltage of the control circuit $V_{GT}=V_{ref}+R13 \cdot I_{GT}$. So the minimum value of the voltage $V_{GT}$ to be led to the base of the second transistor Q2 is $V_{ref}$, or same as the base voltage of the first transistor Q1. The currents $i_1$ and $i_2$ of the differential pair Q1-Q2 are in that case equal in amount, whereupon the current gain $G_I=i_{out}/i_{in}=0,5$. When the source current $I_{GT}$ is enhanced by the control signal G, the voltage $V_{GT}$ is becoming higher according to the expression above. This results in that the current $i_2$ of the second transistor is enhanced and the current $i_1$ of the first transistor is reduced the same amount. The current $i_{in}$ remains unchanged, whereupon the current gain $G_I$ becomes greater than 0,5. The maximum value of the current gain is one, in which case the current $i_{in}$ of the current source 121 flows wholly through the second transistor Q2.

So the gain is controlled by the control signal G. However the value of the gain value is in principle affected also by the temperature. A temperature change causes a change in the difference between control voltages of the differential pair Q1-Q2, or in offset-voltage, and a corresponding change in collector currents $i_1$ and $i_2$. The direction of the change is such that the current $i_2$ and the current gain are reduced when the temperature rises. In the same way a temperature change causes a change in the offset-voltage of the operational amplifier A11, which results in that the values of the collector current $i_2$ and the current gain are changed. To compensate the effect of the temperature, the current source 121 has a built-in temperature dependence: When the temperature rises, the source current $I_{GT}$ is enhanced proportionally to the absolute temperature so that the effect on the gain is equal in amount but opposite, compared with the effect of the changes of the offset-voltages.

A flaw of the above-described arrangement is, that the control range of the gain with it's temperature compensation is only half of the theoretic maximum range. In theory the output current $i_{out}$ can be varied within the range 0 . . . $i_{in}$, corresponding control range 0 . . . 1 of the gain. This could be obtained by arranging the reference voltage, used by the control circuit 120, to be e.g. 0.2 V lower than the reference voltage used by the amplifier proper 110. However, in that case the temperature compensation would not function when the current gain is less than 0.5. On the contrary, a change in the source current $I_{GT}$ would only enhance an error produced inside the differential pair.

SUMMARY OF THE INVENTION

An object of the invention is to reduce said disadvantages related to the prior art. An amplifier according to the invention is characterized in that which is specified in the independent claim 1. A radio device according to the invention is characterized in that which is specified in the independent claim 6. Some preferred embodiments of the invention are specified in the dependent claims.

The basic idea of the invention is as follows: The gain control and temperature compensation of a differential amplifier are implemented by a control circuit, which has a balanced and differential output. The output voltage of the control circuit, or the control voltage, is arranged to be proportional to a difference between two source currents, which difference can be varied on both sides of zero. The output of the control circuit is connected to the bases of the differential pair of the variable gain amplifier, whereupon the ratio of the output current to the input current of the pair becomes dependent on the control voltage. This is arranged to be proportional also to the absolute temperature. A temperature change then changes the control voltage the more the higher is the control voltage. The temperature coefficient is adjusted so that the effect of the temperature on the current difference of the differential pair of the variable gain amplifier is compensated.

An advantage of the invention is that, owing to differential type control circuit, the input current of the amplifier can be steered even wholly to either one of the branches of the differential pair of the amplifier. In that case the current gain can be varied in the whole range 0 ... 1, and the temperature compensation functions correctly also when the current gain is less than 0.5. Another advantage of the invention is that it can be applied on different amplifier structures more versatilly than the solutions according to prior art.

BRIEF DESCRIPTION OF THE DRAWINGS

The invention will now be described in detail. Reference will be made to the accompanying drawings wherein.

DETAILED DESCRIPTION OF THE INVENTION

Figure 1:
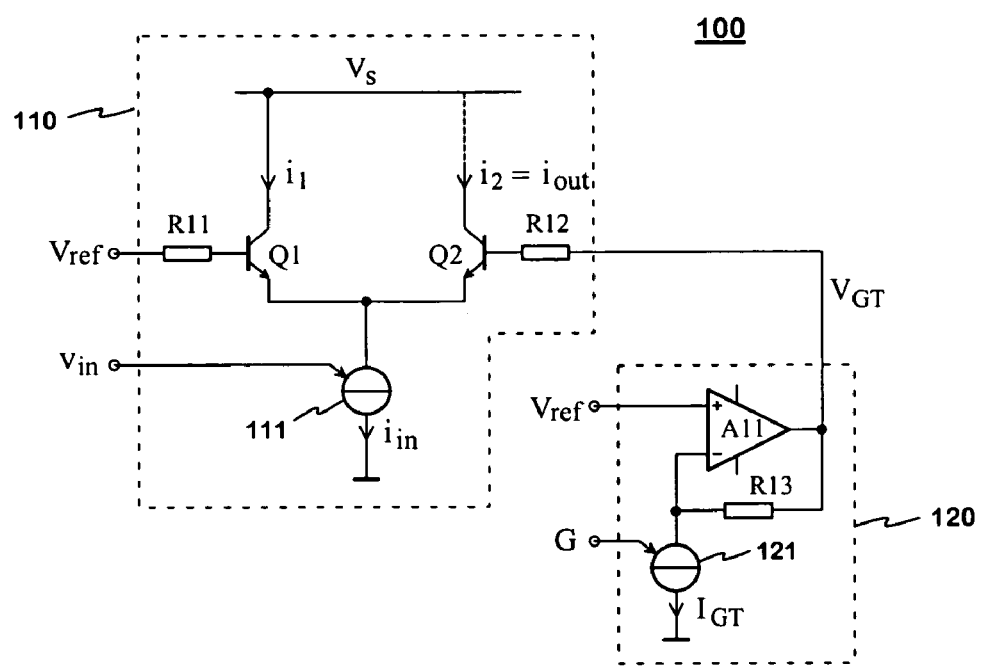
FIG. 1 presents an example of a variable gain amplifier with temperature compensation, according to the prior-art.
Figure 2:
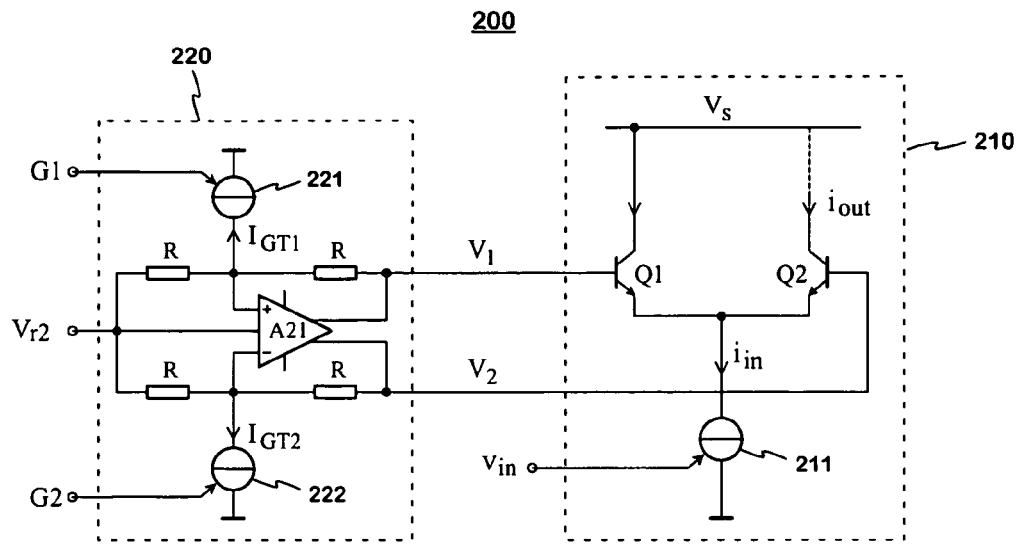
FIG. 2 presents an example of a variable gain amplifier with temperature compensation, according to the invention.

FIG. 2 shows an example of an amplifier according to the invention, the gain of which is variable and which is temperature compensated. The amplifier 200 comprises an amplifier proper 210 and control circuit 220 thereof. The amplifier proper 210 is substantially similar to the amplifier 110 in FIG. 1. It has a bipolar differential pair Q1-Q2, the emitters of which are connected to a signal current source 211 controlled by the input signal $v_{in}$ of the amplifier. The output signal of the amplifier is the collector current $i_{out}$ of the second transistor Q2. The current $i_{in}$ of the source 211 is the total current of the amplifier 210. The current gain $G_I$ of the amplifier is $i_{out}/i_{in}$. Both the base of the first transistor Q1 and the base of the second transistor Q2 are connected to the output of the control circuit 220 for varying the gain and for the temperature compensation.

The control circuit 220 comprises an operational amplifier A21, which has balanced differential output. This means that in the output of the amplifier A21 there are two voltages $V_1$ and $V_2$, which vary oppositely in relation to a certain direct voltage. This direct voltage, or common mode voltage, is set in the amplifier A21 by a reference voltage $V_{r2}$. The voltage difference $V_1-V_2$ is the output voltage of the control circuit 220, the voltage $V_1$ affects in the base of the first transistor Q1 and the voltage $V_2$ affects in the base of the second transistor Q2. The control circuit further comprises a first current source 221 and a second current source 222. The first current source is connected from the non-inverting input of the operational amplifier A21 to the ground and the second current source is connected from the inverting input of the operational amplifier A21 to the ground. Moreover, the non-inverting input is also connected to the reference voltage $V_{r2}$ via a resistor, and to the first terminal of the differential output of the amplifier A21 via another resistor. Correspondingly from the inverting input a resistor is also connected to the reference voltage $V_{r2}$ and another resistor to the second terminal of the differential output of the amplifier A21. The voltage of the first terminal is said $V_1$ and the voltage of the second terminal is said $V_2$. All four resistors have the same resistance R. The output voltage of the control circuit then is $$V_1-V_2=\Delta V=R(I_{GT1}-I_{GT2}),$$

where $I_{GT1}$=current of the first current source and
$I_{GT2}$=current of the second current source.

At least one of the current sources is controllable. In FIG. 2 both of them are marked to be controllable: The first source 221 is controlled by a gain control signal G1 and the second source 222 is controlled by a gain control signal G2. By the control the current difference $I_{GT1}-I_{GT2}$ can be set positive or negative. Thus the output voltage $\Delta V$ of the control circuit can be varied within certain range on both sides of zero. This further results in that it is possible to steer the total current $i_{in}$ of the amplifier proper even wholly either through the first transistor Q1 or through the second transistor Q2. In the former extreme case the output current $i_{out}$ is zero for which reason also the current gain $G_I$ is zero. In the latter extreme case the current gain $G_I$ is about one.

In order that temperature changes would not affect the gain, both the first and the second current source have built-in temperature dependence: Their currents are proportional to the absolute temperature. Let us suppose a situation where the current gain $G_I$ is set at a value 0.8, and the temperature changes upwards. So the current $i_{out}$ of the second transistor is higher than the current of the first transistor Q1, which results in that the rise of the temperature tends to reduce the current $i_{out}$ and the current gain. In the situation at issue the voltage difference $\Delta V$ is negative and the second source current $I_{GT2}$ is higher than the first source current $I_{GT1}$. This means that the rise of the temperature enhances the second source current more than the first source current. So the change in the differences $I_{GT1}-I_{GT2}$ and $\Delta V$ is proportional, besides to the change in absolute temperature, also to the value of the difference itself. The changing of the voltage difference $\Delta V$ even more negative causes increase in the output current $i_{out}$. So the temperature change affects the output current in two ways having opposite directions. By means of internal arrangement of the first and second current source and by the value of the resistance R absolute values of these effects are brought equal, whereupon the temperature compensation comes true. When the temperature lowers, the sign of all changes turns compared with above-depicted.

As the current gain is less than 0.5, the current in the transistor Q2 is lower than in the transistor Q1, in which case the temperature rise tends to increase the current $i_{out}$. The first source current $I_{GT1}$ is higher than the second source current $I_{GT2}$, and the differences $I_{GT1}-I_{GT2}$ and $\Delta V$ change still more positive, which causes decrease in the output current $i_{out}$. So the compensation comes true in that case, too. In fact, the compensation is most important when the output current is low, because the relative effects of the temperature changes are greatest at that time.

Figure 3:
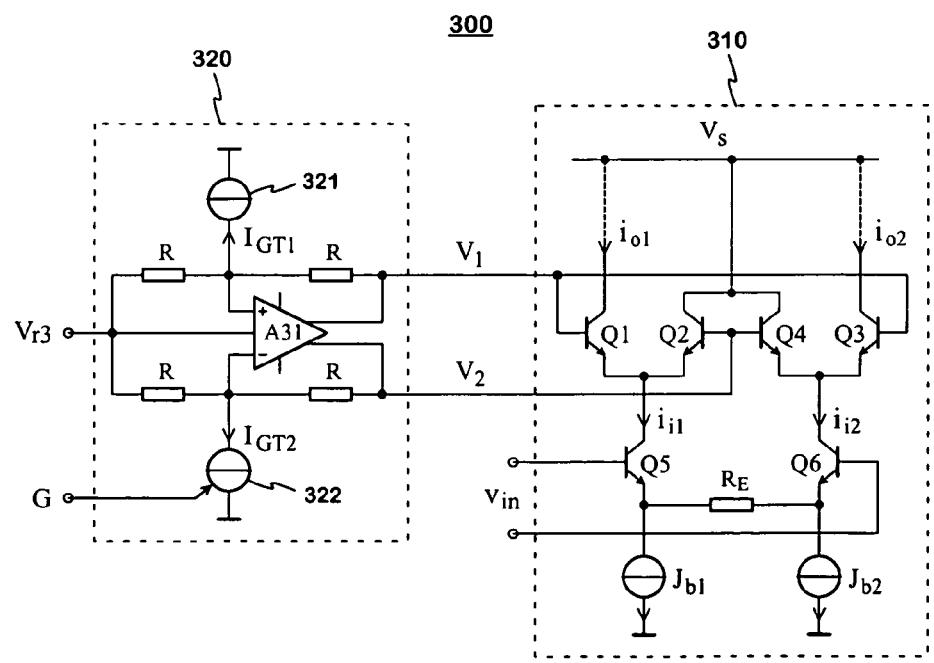
FIG. 3 presents another example of a variable gain amplifier with temperature compensation, according to the invention.

FIG. 3 shows another example of an amplifier according to the invention, the gain of which is variable and which is temperature compensated. The amplifier 300 comprises an amplifier proper 310 and control circuit 320 thereof. The control circuit is similar to that in FIG. 2. The amplifier proper 310 is now fully differential. It has three differential pairs. The first pair formed by transistors Q1 and Q2 and the second pair formed by transistors Q3 and Q4 are connected parallel such that the bases of the transistors Q1 and Q3 are connected together as well as the bases of the transistors Q2 and Q4. The first output terminal of the control circuit 320, the voltage of which is $V_1$, is connected to the former bases, and the second output terminal, the voltage of which is $V_2$, is connected to the latter bases. The collectors of the transistors Q2 and Q4 are connected directly to the supply voltage $V_s$. The collector of the transistor Q1 is connected to the supply voltage through a load, as well as the collector of the transistor Q3. The collector current $i_{o1}$ of the transistor Q1 and the collector current $i_{o2}$ of the transistor Q3 are output quantities of the amplifier. They are differential: As the one is increasing the other is decreasing, the input signal $v_{in}$ of the amplifier being changing.

The third differential pair is formed by the transistors Q5 and Q6. The collector of the transistor Q5 is connected to the emitters of the first pair, thus the current $i_{t1}$ of the transistor Q5 is the same as the total current of the first pair. Correspondingly the collector of the transistor Q6 is connected to the emitters of the second pair, thus the current $i_{t2}$ of the transistor Q6 is the same as the total current of the second pair. The third pair is controlled by the input signal $v_{in}$ of the amplifier, which exists between the bases of the transistors Q5 and Q6. A biasing current source $J_{b1}$ is connected from the emitter of transistor Q5 to the ground and a biasing current source $J_{b2}$ is connected from the emitter of transistor Q6 to the ground. A resistor $R_E$ is connected between these emitters, which affects the base gain of the amplifier 310.

If the output voltage $\Delta V = V_1 - V_2$ of the control circuit is lowering, a part of the current of transistor Q1 is moved from the load to transistor Q2 and a part of the current of transistor Q3 is moved from the load to transistor Q4, which means that the gain decreases. Correspondingly the gain increases, if the output voltage $\Delta V$ rises. The output voltage $\Delta V$ is changed by the gain control signal G, which affects the second current source 322. The temperature compensation functions, regarding both the first differential pair Q1-Q2 and the second differential pair Q3-Q4, in the same way as in the circuit shown in FIG. 2. Regarding the third differential pair Q5-Q6 the temperature compensation is implemented for instance by the above-mentioned biasing current sources $J_{b1}$ and $J_{b2}$.

Figure 4:
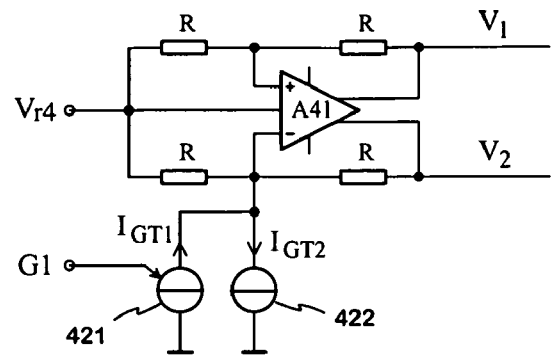
FIG. 4 presents an alternative current source arrangement in the control circuit of the amplifier.

FIG. 4 shows an alternative current source arrangement in the control circuit of the amplifier. The control circuit 420 is similar to the control circuit 220 in FIG. 2. The only difference is, that the current source 421 corresponding the first current source 221 in FIG. 2 is now connected to the same node as the current source 422 corresponding the second current source 222 in FIG. 2, which node is connected to the inverting input of the operational amplifier A41. The current of the second current source 422 is away from the node as in FIG. 2, but the current of the moved current source 421 now is towards the node. By using two current sources a change in the output voltage $\Delta V$ also in this case is made proportional, besides to the change in absolute temperature, also to the value of the difference $\Delta V$ itself. This would not have succeeded using one source.

Figure 5:
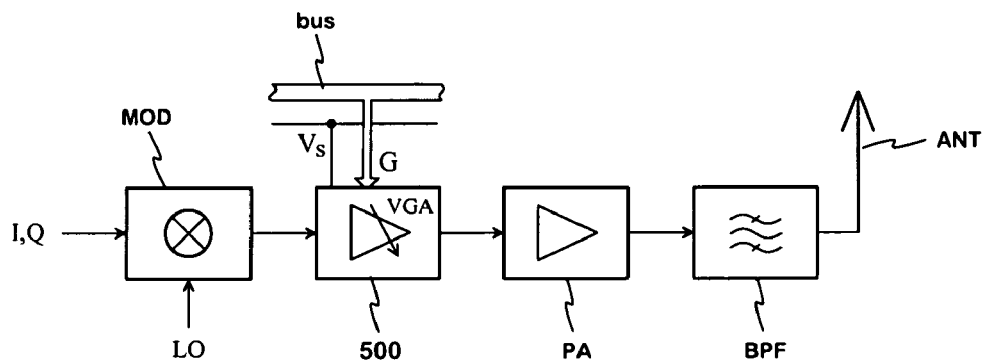
FIG. 5 presents a transmitter of a radio device according to the invention as a block diagram.

FIG. 5 shows a transmitter of a radio device as a simplified block diagram. The transmitter comprises, listed in the propagation direction of the signal to be transmitted, a modulator MOD, a variable gain amplifier VGA according to the invention, a power amplifier PA, an antenna filter BPF of the transmitting side and an antenna ANT. The analogous converted parts I and Q of the signal to be transmitted and a carrier LO are led to the quadrature type modulator from a local oscillator. The supply voltage $V_s$, from which the reference voltages required in the control also are generated inside the amplifier block 500, is led to the variable gain amplifier. The temperature dependent current sources required in the control and compensation are also located inside the amplifier block. The amplifier 500 is joined to the bus of the radio device, through which bus the gain control signal G is taken programmably. Naturally there may also be two gain control signals, too, according to FIG. 2.

Figure 6:
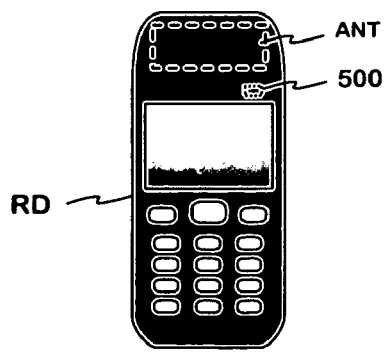
FIG. 6 presents an example of a radio device according to the invention.

FIG. 6 shows an example of a radio device according to the invention. The radio device RD comprises a transmitter similar to that shown in FIG. 5. The antenna ANT and the variable gain amplifier 500 of the transmitter are drawn in FIG. 6 in broken lines.

Amplifier according to the invention is described above. The invention is not limited only to the depicted structures; the circuit solutions can vary widely. The inventional idea can be applied in different ways within the scope defined by the independent claim 1.

What is claimed is:

1. A temperature compensated amplifier with variable gain comprising at least one differential pair, total current of which being arranged to be dependent on input signal of the amplifier and one collector current of which being output signal of the amplifier, the amplifier further comprising a control circuit to change a control of transistors of the differential pair so that the ratio of said one collector current to the total current, or current gain, changes corresponding to changes in a gain control signal and as a function of the temperature so that the effect of the temperature change on the collector currents inside the differential pair is substantially compensated, wherein;

the control circuit has a differential output, first terminal of which is connected to base of first transistor of the differential pair and second terminal of which is connected to base of second transistor of the differential pair, the control circuit comprises a first and a second current source, the current difference of which sources can be varied on both sides of zero by means of said gain control signal, output voltage of the control circuit is proportional to said current difference, the output voltage can thus be varied on both sides of zero to set the current gain to be more or less than 0.5, the currents of the first and second current source are arranged to be dependent on the temperature, wherein a change in the output voltage of the control circuit being due to a temperature change, depends on both temperature difference and said current difference and causes changes in the collector currents of the differential pair, which changes have opposite sign compared with the immediate effect of said temperature change on said collector currents inside the differential pair, and the control circuit is further arranged such that above-mentioned changes with opposite signs in each collector current of the differential pair are substantially equal regarding their absolute values.

2. The amplifier according to claim 1, the currents ($I_{GT1}$, $I_{GT2}$) of the first and second current sources depending linearly on the absolute temperature, wherein a change in the output voltage of the control circuit being due to a temperature change, is linearly proportional both to temperature difference and to the value of said current difference itself.

3. The amplifier according to claim 1, the control circuit comprising an operational amplifier with a differential output, and the first current source being connected from the non-inverting input of the operational amplifier to the ground and the second current source being connected from the inverting input of the operational amplifier to the ground, from the non-inverting input further being connected a resistor to a reference voltage and another resistor to first terminal of the differential output of the amplifier and from the inverting input further being connected a resistor to the reference voltage and another resistor to second terminal of the differential output of the operational amplifier, which all four resistors have the same resistance, wherein the output voltage of the control circuit is product of said resistance and said current difference.

4. The amplifier according to claim 3, wherein the arrangement of the control circuit such that the changes with opposite signs in each collector current of the differential pair are substantially equal regarding their absolute values, is implemented by choosing a suitable value for said resistance.

5. The amplifier according to claim 1, having two differential pairs of said type, e.g. first and second pair, connected parallel such that the bases of first transistors of these pairs are connected to the first output terminal of the control circuit and the bases of second transistors of these pairs are connected to the second output terminal of the control circuit, and said input signal is arranged to be fed to a separate third differential pair, the collector of first transistor of which third pair being connected to the emitters of the transistors of the first pair and the collector of second transistor of the third pair being connected to the emitters of the transistors of the second pair.

6. A radio device, a transmitter of which has a temperature compensated amplifier with variable gain to set the transmitting power and to keep the transmitting power independent of the temperature, the amplifier comprising at least one differential pair, total current of which being arranged to be dependent on input signal of the amplifier and one collector current of which being output signal of the amplifier, the amplifier further comprising a control circuit to change a control of transistors of the differential pair so that the ratio of said one collector current to the total current, or current gain, changes corresponding to changes in a gain control signal and as a function of the temperature so that the effect of the temperature change on the collector currents inside the differential pair is substantially compensated, wherein;

the control circuit has a differential output, first terminal of which is connected to base of first transistor of the differential pair and second terminal of which is connected to base of second transistor of the differential pair, the control circuit comprises a first and a second current source, the current difference of which sources can be varied on both sides of zero by means of said gain control signal, output voltage of the control circuit is proportional to said current difference, the output voltage can thus be varied on both sides of zero to set the current gain to be more or less than 0.5, the currents of the first and second current source are arranged to be dependent on the temperature, wherein a change in the output voltage of the control circuit, being due to a temperature change, depends on both temperature difference and said current difference and causes changes in the collector currents of the differential pair, which changes have opposite sign compared with the immediate effect of said temperature change on said collector currents inside the differential pair, and the control circuit is further arranged such that the above-mentioned changes with opposite signs in each collector current of the differential pair are substantially equal regarding their absolute values.

* * * * *